(12) United States Patent
Soto

(10) Patent No.: US 6,473,724 B1
(45) Date of Patent: Oct. 29, 2002

(54) METHOD OF DESIGNING EMBOSSED RIBS IN PLATES

(75) Inventor: Ciro Angel Soto, Dearborn, MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/307,863

(22) Filed: May 10, 1999

(51) Int. Cl.$^7$ .......................... G06F 17/50; G06F 17/10; G06F 7/60; G06G 7/48
(52) U.S. Cl. ........................ 703/7; 703/1; 703/2; 703/6; 174/69
(58) Field of Search ................................. 703/1, 2, 6, 7

(56) References Cited

U.S. PATENT DOCUMENTS

| | | | |
|---|---|---|---|
| 5,437,190 A | | 8/1995 | Ehrenpreis et al. |
| 5,443,884 A | * | 8/1995 | Lusignea et al. ............ 428/116 |
| 5,559,729 A | * | 9/1996 | Abe ............................. 703/2 |
| 5,654,077 A | | 8/1997 | Wu et al. |
| 5,828,003 A | * | 10/1998 | Thomeer et al. .............. 174/69 |

OTHER PUBLICATIONS

Jaunky et al.; "Optimal design of general stiffened composite circular cylinders for global buckling with strength constraints"; Composite Structures; pp. 243–252.*

Muc; "Transverse shear effects in discrete optimization of laminated compressed cylindrical shells"; Composite Structures; pp. 489–497.*

Punch et al.; "Using genetic algorithms to design laminated composite structures"; IEEE Expert; pp. 42–49.*

Kodiyalam et al.: "Composite sandwich structure optimization with application to satellite components"; J. AIAA; pp. 614–621; 1995.*

Nagendra et al.: "Optimal stacking sequence of stiffened composite panels with cutouts"; CCMS–94–07; Virginia Polytechnic Institute and State University; abstract & chapters 4–5.; Jul. 1994.*

Avalle et al.; "A theoretical approach to the optimization of flexural stiffness of symmetric laminates."; Composite Structures; pp. 75–86; 1995.*

Davalos et al.; "Multiobjective material architecture optimization of pultruded FRP I–beams"; Composite Materials; pp. 271–281; Jul. 1996.*

Ikuo Nakada and Eberhard Haug, "Numerical Simulation of Crash Behavior of Composite Structures For Automotive Applications", 1996 ( 5 pages—NJ—Jan. 26, 2002).

Mario Da Re, Roberto De Bernardi, Fritz Hatt, and Michele Guida, Mechanical Engineering, "Fiat Uses CAE To Stamp Metal For New Oil Pan", Apr. 1994 (4 pages—NJ—Jan. 26, 2002).

SDRC Product Catalog—Application Sets—Simulation Set, 1998 (17 pages—Jan. 26, 2002) NJ.

* cited by examiner

*Primary Examiner*—Hugh M. Jones
(74) *Attorney, Agent, or Firm*—David B. Kelley

(57) ABSTRACT

A method is provided of designing embossed ribs in a plate. The method includes the steps of inputting data of a loaded un-embossed plate and computing orthotropic properties of an embossed ribbed plate material for the plate. The method also includes the steps of computing stresses on the plate and computing optimum orientation of embossed ribs at each point in the plate using the computed stresses and orthotropic properties of the plate. The method includes the steps of computing gradient of objective function and constraints and solving local optimization to obtain a new location and spacing of the embossed ribs in the plate. The method further includes the step of outputting orientation, location and spacing of the embossed ribs in the plate.

9 Claims, 2 Drawing Sheets

METHOD OF DESIGNING EMBOSSED RIBS IN PLATES

BACKGROUND OF THE INVENTION

1. Field of the Invention

The present invention relates generally to embossed ribs in plates and, more specifically, to a method of designing embossed ribs in plates.

2. Description of the Related Art

Structural topology optimization is a known technology in the aerospace and automotive industry. Only a decade ago, most structural topology optimization had been done with truss-like structures that are used extensively in the aerospace industry. In the automotive industry, structural topology optimization of plates has been used in many components of vehicle design such as floor panels, roof, doors, hoods, etc. Most of these applications in the automotive industry have solved the problem of lightening the structure by locating and shaping holes in plates. Another typical application of structural topology optimization in ground transportation vehicles is in determining the optimum reinforcement of an existing part in order to maximize its performance.

It is known in the automotive industry to stamp body panels for a motor vehicle. The body panels are typically a flat plate with a curvature to fit into the interior of the motor vehicle. To increase the stiffness of the plate without increasing its weight, one possible solution is to stamp the plate and emboss ribs in the plate.

An approach to solve the structural topology optimization of embossed ribs is to use beam elements. A superimposed grid of designable beam elements is added to the undesignable shell element mesh by connecting all nodes within each quadrilateral (or triangular) elements in all possible ways (6 beams/element at most). However, a limitation of this approach is the dependency of the beam mesh on the topology of the shell mesh, which limits the range of orientation for the embossed ribs.

Previous structural topology optimization of plates concerned the issue of finding optimum topology of plate thicknesses. The final result was a locally isotropic plate with two discrete thicknesses optimally distributed in the plate domain (with the possibility of having one or two gages set to zero). However, a limitation of this approach is that the final result is meant to be locally isotropic, missing the orthotropy nature of embossed ribs.

Another approach to solve the structural topology optimization of plates uses a computational procedure where a two-material composite structure is optimally designed by computing the distribution of one of the materials (reinforcing material) within the other (matrix material). The reinforcing material is also locally designed within the matrix in order to determine its tensorial properties pointwise.

Although the above approaches have worked, it is desirable to design an optimally reinforced plate. It is also desirable to design embossed ribs that are optimally located and orientated in plates. It is further desirable to provide a process that will be more accurate in the representation of the structural properties of embossed plates than the former two-gage thickness distribution of isotropic plates. Therefore, there is a need in the art to provide a method of designing embossed ribs in plates.

SUMMARY OF THE INVENTION

Accordingly, the present invention is a method of designing embossed ribs in plates. The method includes the steps of inputting data of a loaded un-embossed plate and computing orthotropic properties of an embossed ribbed plate material for the plate. The method also includes the steps of running structural analysis and obtaining stress on the plate. The method includes the steps of computing stiffness of the plate. The method includes the steps of computing the optimum orientation of the embossed ribs at each point in the plate using the computed stresses and orthotropic properties of the plate. The method includes the step of computing the gradient of objective function and constraints. The method includes the steps of solving local optimization problem to obtain a new location and spacing of the embossed ribs in the plate and outputting orientation, location and spacing of the embossed ribs in the plate.

One advantage of the present invention is that a method of designing embossed ribs in plates is provided for motor vehicle panels. Another advantage of the present invention is that the method uses special stiffness properties for membrane and bending deformations separately. Yet another advantage of the present invention is that the method combines stiffness properties of flat plates and embossed ribbed plates to solve the structural topology optimization of embossed ribs. Still another advantage of the present invention is that the method provides an optimally reinforced plate, the one with embossed ribs optimally located and oriented, which is locally orthotropic, that is, with two principal (in-plane) directions, one parallel to the ribs and another orthogonal to them. A further advantage of the present invention is that the method can be used to increase the stiffness of plates without increasing weight, allowing a reduced plate thickness, and therefore, a lighter plate. Yet a further advantage of the present invention is that the method is more accurate in the representation of the structural properties of embossed plates than the former two-gage thickness distribution of isotropic plates.

Other features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
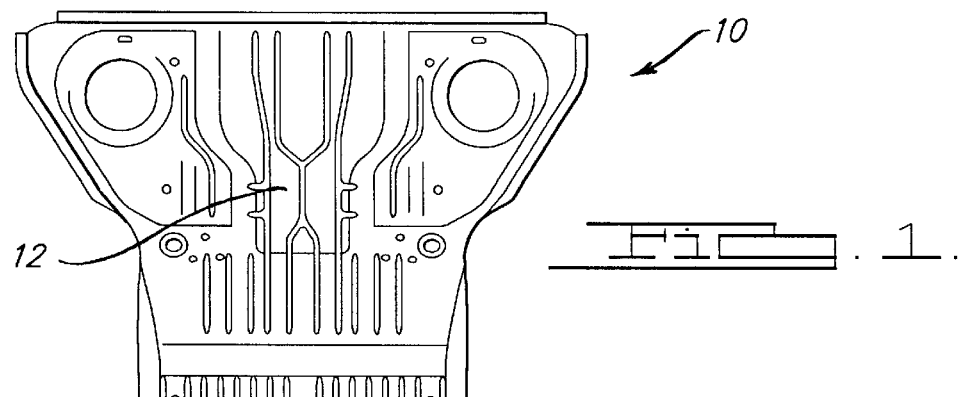
FIG. 1 is a plan view of a plate with embossed ribs designed by a method, according to the present invention, for use in a motor vehicle.

Referring to the drawings and in particular FIG. 1, one embodiment of an embossed ribbed plate 10, according to the present invention, is shown for a motor vehicle (not shown). The embossed rib plate 10 is essentially a flat or planar plate 12 having a plurality of embossed ribs 14. The embossed ribs 14 extend outwardly, in this example, from a plane of the plate 12. The embossed ribs 14 also extend longitudinally. The embossed ribs 14 may be in the shape of corrugations, indentations, beads, grooves and the like in the panel 12. The embossed ribs 14 and plate 12 are integral, unitary and formed as one-piece by conventional stamping. In the embodiment illustrated, the embossed rib plate 10 is a floor panel of the motor vehicle. It should be appreciated that embossed ribbed plates could be used for other vehicle body parts of the motor vehicle.

Figure 2:
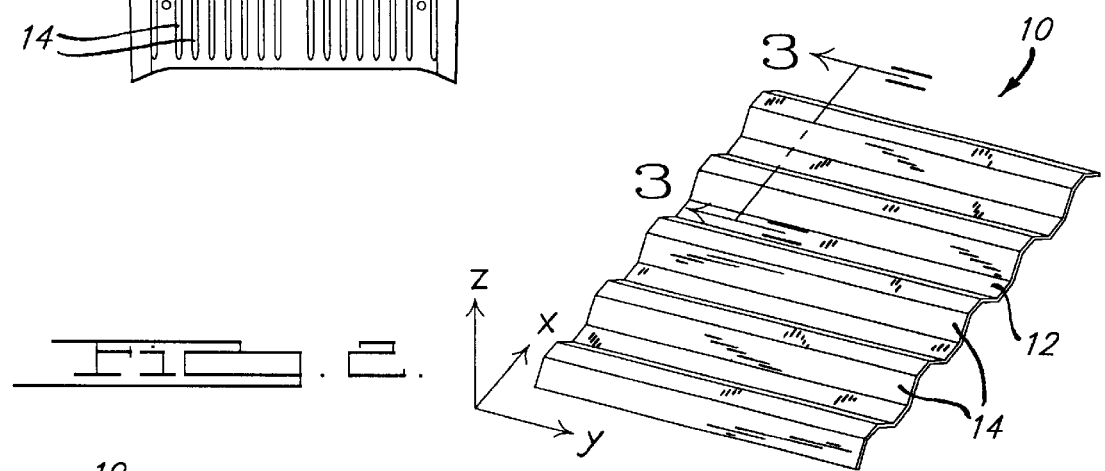
FIG. 2 is a perspective view of a portion of an embossed ribbed plate.
Figure 3:
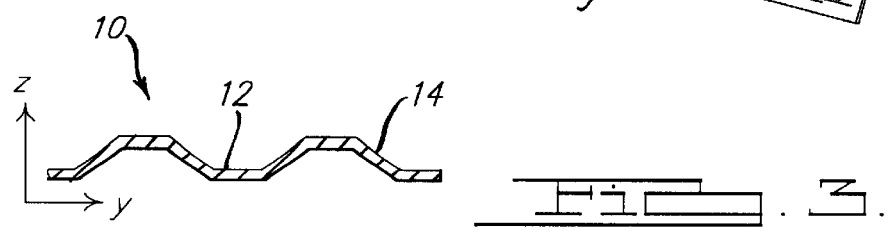
FIG. 3 is a sectional view taken along line 3—3 of FIG. 2.

As illustrated in FIGS. 2 and 3, the plate 12 with the embossed ribs 14 extending in the 'x' direction and subjected to in-plane loading will have a higher stiffness in the 'x' axis than in the 'y' axis. Similarly, the bending stiffness for pure bending deformations on the z-x plane is higher than for bending deformations contained in the z-y plane. This particular behavior of embossed ribbed plates must be captured with the elasticity tensor for membrane and deformations used during the solution of the boundary value problem.

Elasticity tensors for membrane and bending depend on the actual geometry of the rib that is to be embossed and can be obtained with standard computer simulated tests in such plates. The following tensors are shown as typical examples to model embossed ribs for membrane and bending deformations, respectively:

$$E^R = \begin{bmatrix} \beta_E E_{22}^R & E_{12}^R & 0 \\ E_{12}^R & E_{22}^R & 0 \\ 0 & 0 & E_{33}^R \end{bmatrix} \quad B^R = \begin{bmatrix} \beta_B B_{22}^R & B_{12}^R & 0 \\ B_{12}^R & B_{22}^R & 0 \\ 0 & 0 & B_{33}^R \end{bmatrix}$$

with $\beta_E > 1$, $\beta_B > 1$.

Figure 4:
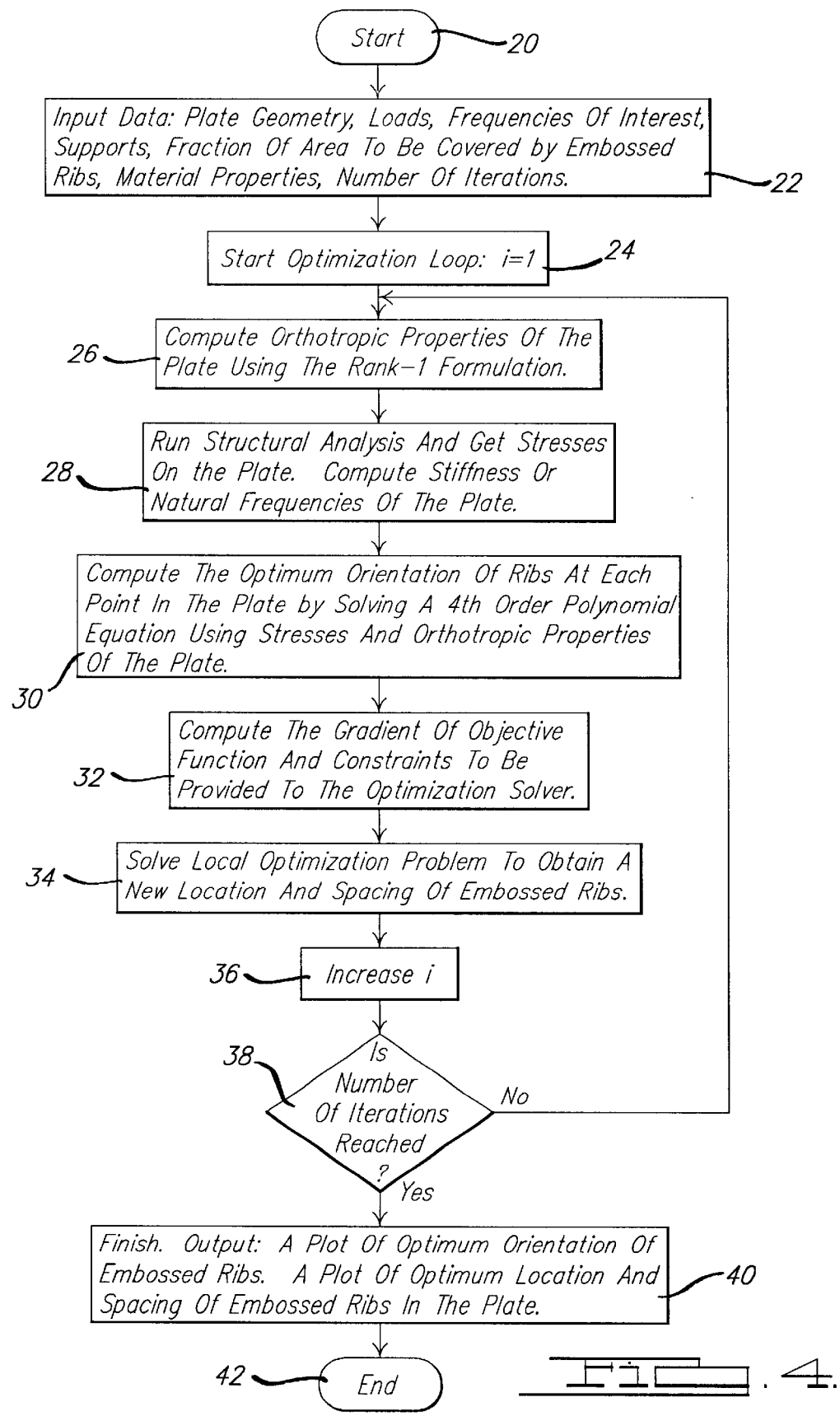
FIG. 4 is a flowchart of a method, according to the present invention, of designing embossed ribs in a plate.

Referring to FIG. 4, a method, according to the present invention, of designing embossed ribs in plates to form the embossed ribbed plate 10 is shown. The method is carried out on a conventional computer (not shown). The method begins or starts in bubble 20 and advances to block 22. In block 22, the method includes inputting data of a loaded un-embossed plate 12. The data includes geometry of the plate 12, frequencies of interest (to be optimized) of the plate 12, supports for the plate 12, fraction of area of the plate 12 to be covered by the embossed ribs 14, material properties of the plate 12, and the number of iterations to be performed.

Figure 5:
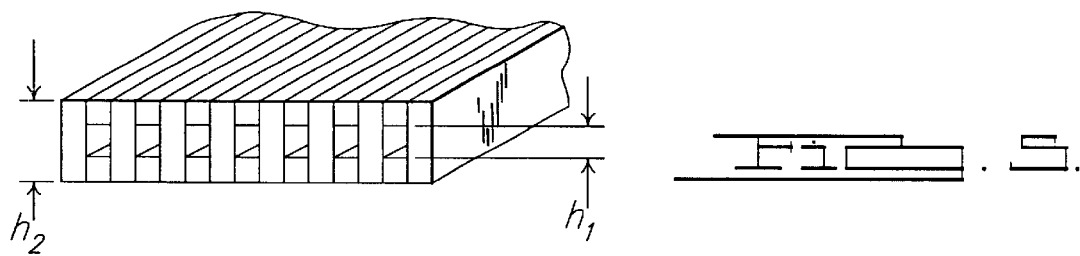
FIG. 5 is a diagrammatic view of a plate having two different materials periodically alternated.

From block 22, the method advances to block 24 and starts optimization by setting a variable for iterations of optimization i equal to a predetermined value or number such as one (1). The method then advances to block 26 and computes orthotropic properties of the embossed ribbed plate material for the plate 12. The orthotropic properties are computed using a rank-1 formulation. The materials used to simulate embossed ribs is taken from Soto, C. A., Diaz, A. R. (1993), "On the Modeling of Ribbed Plates for Shape Optimization," Structural Optimization, Vol. 6, pp. 175–188, the disclosure of which is hereby incorporated by reference. As illustrated in FIG. 5, the materials are layered materials represented as material 1 and material 2. Using $h_1=0.5$ and $h_2=1.548$, it is possible to achieve the required membrane stiffness properties in the direction of the ribs. The use of homogenization techniques is used to compute the following membrane stiffness properties:

$$E^R = \frac{E}{1-v^2} t \begin{bmatrix} 1.0987 & 0.2492 & 0 \\ 0.2492 & 0.8306 & 0 \\ 0 & 0 & 0.2907 \end{bmatrix}$$

Figure 6:
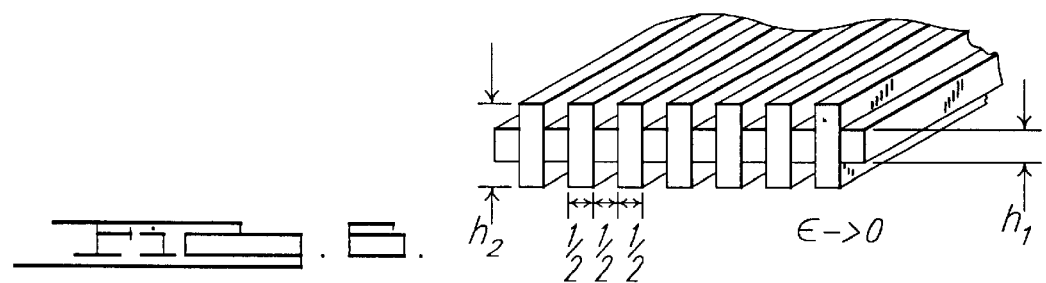
FIG. 6 is a diagrammatic view of a plate having two different materials periodically alternated.

The Rank-1 perforated plate (FIG. 5) is used to simulate embossed rib properties for membrane deformations. As illustrated in FIG. 6, Rank-1 ribbed (not embossed) plate is used to simulate embossed rib properties for bending deformations. Using $h_1=0.811$ and $h_2=2.0$, it is possible to achieve the required bending stiffness properties of the ribbed plate material. The use of homogenization techniques is used to compute the following bending stiffness properties:

$$B^R = \frac{E}{1-v^2} t^3 \begin{bmatrix} 0.3638 & 0.0275 & 0 \\ 0.0275 & 0.0916 & 0 \\ 0 & 0 & 0.0321 \end{bmatrix}$$

From block 26, the method advances to block 28 and runs a structural analysis (not shown) to get stress on the embossed ribbed plate 10. The method also computes the stiffness or natural frequencies of the embossed rib plate 10. Stiffness properties are a function of the design variable, c, that is the embossed rib density, and the stiffness properties of a flat plate and a ribbed plate. Expressed mathematically, properties for membrane, E, and bending, B, deformations are:

$$E=E(c, E^F, E^R) \text{ and } B=B(c, B^F, B^R)$$

Where the superscript F denotes "flat isotropic plate" and the R denotes "embossed ribbed plate".

After block 28, the method advances to block 30 and computes the optimum orientation of the embossed ribs 14 at each point in the plate 12. The computation is carried out by solving a $4^{th}$ order polynomial equation using stresses and orthotropic properties of the plate 12. The stress-based method was chosen as the solution strategy for the optimum orientation. The angle θ is computed solving the following equation:

$$\sum_{i=1}^{N} w_i \left( \varepsilon^i \frac{\partial E}{\partial \theta} \varepsilon^i + \kappa^i \frac{\partial B}{\partial \theta} \kappa^i + \gamma^i \frac{\partial S}{\partial \theta} \gamma^i \right) = 0$$

Where N is the number of load conditions (independent load cases), and $w_i$s are prescribed convex weights, i.e., $$\sum_{i=1}^{N} w_i = 1.$$

The equation can be written as a $4^{th}$ order polynomial in tan(θ). It should be appreciated that there is no need to solve the optimum orientation problem with optimization techniques since the solution of the fourth order polynomial gives the solution in one step for a given stress field.

After block 30, the method then advances to block 32 and computes the gradient of objective function and constraints according to standard design sensitivity analysis techniques. These results are to be provided to an optimization solver. In this embodiment, a linear programming solver (not shown) was used, however, the method is not limited to linear programming solvers.

From block 32, the method advances to block 34 and solves local optimization problem to obtain a new location and density of the embossed ribs 14 on the plate 12. After block 34, the method advances to block 36 and increases the variable i by a predetermined number or value such as one. The method then advances to diamond 38 and determines whether the number of iterations has reached a predetermined value such as ten (10). If not, the method returns to block 26 previously described. If so, the method advances to block 40 and outputs the optimum orientation of the embossed ribs 14 on the plate 12. The output also includes a plot of the optimum location and spacing of the embossed ribs 14 in the plate 12. The plot or information corresponding to the plot is given to an engineer who determines the height and number of embossed ribs 14 to be stamped based on the information provided by the plots of optimum location, spacing and orientation which were outputted by the method in block 40. The method then ends in bubble 42.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method of designing embossed ribs in a plate, said method comprising the steps of:

inputting data of a loaded un-embossed plate;

computing orthotropic properties of a material for the plate;

computing stresses on the plate;

computing optimum orientation of embossed ribs at each point in the plate using the computed stresses and orthotropic properties of the plate;

computing gradient of objective function and constraints;

solving local optimization to obtain a new location and spacing of the embossed ribs in the plate; and outputting orientation, location and spacing of the embossed ribs in the plate.

2. A method as set forth in claim 1 wherein said step of inputting data comprises at least two from a group comprising geometry of the plate, loads on the plate, frequencies of interest of the plate, supports for the plate, fraction of area of the plate to be covered by embossed ribs, material properties of the plate, and number of times optimization is to be performed.

3. A method as set forth in claim 1 including the step of initially setting an iteration variable for the each time optimization is to be performed equal to a minimum predetermined value.

4. A method as set forth in claim 1 including the step of incrementing the iteration variable by a predetermined value after said step of solving.

5. A method as set forth in claim 1 including the step of determining whether the iteration variable is greater than a maximum predetermined value.

6. A method as set forth in claim 5 including the step of returning to said step of computing orthotropic properties if the iteration variable is not greater than the maximum predetermined value.

7. A method as set forth in claim 1 wherein said step of computing stresses comprises running a structural analysis to get stresses on the plate.

8. A method as set forth in claim 1 including the step of computing stiffness or natural frequencies of the plate.

9. A method as set forth in claim 1 wherein said step of computing gradient of objective function comprises computing the gradient of objective function and constraints and providing the results to an optimization solver.

* * * * *